United States Patent [19]
Godinho et al.

[11] Patent Number: 5,124,774
[45] Date of Patent: Jun. 23, 1992

[54] COMPACT SRAM CELL LAYOUT

[75] Inventors: Norman Godinho, Los Altos Hills; Tsu-Wei F. Lee, Monte Sereno; Hsiang-Wen Chen, Cupertino; Richard F. Motta, Los Altos; Juine-Kai Tsang, Palo Alto; Joseph Tzou, Belmont; Jai-Man Baik, San Jose; Ting-Pwu Yen, Fremont, all of Calif.

[73] Assignee: Paradigm Technology, Inc., San Jose, Calif.

[21] Appl. No.: 555,559

[22] Filed: Jul. 19, 1990

Related U.S. Application Data

[63] Continuation-in-part of Ser. No. 464,496, Jan. 12, 1990.

[51] Int. Cl.$^5$ .............. H01L 27/02; H01L 23/48; G11C 11/00; G11C 11/34
[52] U.S. Cl. .................... 357/41; 357/59; 357/71; 365/154; 365/182; 365/188
[58] Field of Search ............ 357/41, 59, 67, 71, 357/63; 365/154, 182, 188

[56] References Cited

U.S. PATENT DOCUMENTS

| | | | |
|---|---|---|---|
| 4,128,670 | 12/1978 | Gaensslen | 357/59 |
| 4,300,212 | 11/1981 | Simko | 357/59 |
| 4,663,739 | 5/1987 | Monk | 365/154 |
| 4,774,203 | 9/1988 | Ikeda et al. | 437/52 |

OTHER PUBLICATIONS

IEEE Transactions on Electron Devices, vol. 36 #9 pp. 1657-1662 by Minami et al.

Primary Examiner—Mark Prenty
Attorney, Agent, or Firm—Skjerven, Morrill, MacPherson, Franklin & Friel

[57] ABSTRACT

A compact cell design for a static random access memory cell is achieved. The cell has two transistors with gates substantially parallel to each other. One interconnect connects the gate of one transistor to an electrode of the other transistor. Another interconnect connects the gate of the other transistor to an electrode of the first transistor. The two gates and the two interconnects form substantially a rectangle. A power supply circiut line is disposed outside the rectangle. This line and the two interconnects are formed from one conductive layer.

16 Claims, 12 Drawing Sheets

COMPACT SRAM CELL LAYOUT

This is a continuation-in-part of application Ser. No. 464,496, filed Jan. 12, 1990.

FIELD OF THE INVENTION

This invention relates to a compact cell design for a static random access memory (SRAM) cell.

BACKGROUND OF THE INVENTION

A semiconductor digital memory such as a static random access memory (SRAM) is arranged as an array of individual memory cells, each cell storing a single bit of information, either a 1, high voltage, or a 0, low voltage.

The basic SRAM cell is well known. FIG. 1 illustrates a typical circuit schematic for an SRAM cell utilizing load resistors $R_1$ and $R_2$ connected to the $V_{CC}$ line. Alternatively, resistors $R_1$ and $R_2$ may each be replaced by a transistor having a selectively biased gate, forming the equivalent of a load resistor. Pull down transistors $T_1$ and $T_2$ are cross-coupled to ensure that when one of those transistors is off, the other transistor is on. For instance, if transistor $T_2$ is on then the voltage on node A is low, approximately at ground, while transistor $T_1$ is off and the voltage on node B is high, approximately at $V_{CC}$. In this case the current through $R_2$ is typically tens of pico-amps if $R_2$ has a high resistance value such as 100 giga-ohms. Conversely, if transistor $T_1$ is on then the voltage on node B is low while transistor $T_2$ is off and the voltage at node A is high.

Pass transistors $T_3$ and $T_4$ act as switches to enable measurement for change in the state of the cell. Transistors $T_3$ and $T_4$ are turned on by the bit select control signal produced from the external decoding of address lines. For instance, if the voltage on node A is low, this state is detected at bit line $\overline{BL}$ when pass transistor $T_4$ is turned on by applying a high level signal to the word line WL in a well-known manner. The state of the SRAM cell may be changed by forcing the appropriate bit line BL or $\overline{BL}$ to ground.

In the prior art each circuit line including both bit lines BL and $\overline{BL}$, word line WL, the $V_{CC}$ line and the $V_{SS}$ line are typically formed from conductive layers above the silicon substrate.

FIGS. 2 and 3 show a group of four SRAM cells having a prior art cell layout. In FIGS. 2 and 3, which show only some of the cell components for clarity, each cell occupies one quadrant as divided along lines A—A and B—B. A legend for interpreting the different shading types and outlines is provided as FIG. 4.

Reference numerals 1 and 2 each indicate the gate of one pull down transistor of the cell occupying the lower right hand quadrant of FIG. 2. Mask lines 22a and 22b outline the mask openings which may be used to open gate contacts 3a and 3b, respectively, through an overlying oxide layer (not shown). Shaded areas 4a-4d show the location of active island regions which are separated by field oxide 5. Reference numbers 4a and 4b indicate drain regions and reference numbers 4c and 4d indicate source regions. Buried contacts 6a and 6b are each formed as openings in an insulating layer overlying the active regions for exposing the drain region of each pull down transistor of the cell.

A conductive strip forms cross-coupling interconnect 7a which electrically connects the drain region exposed by buried contact 6a to gate 2, exposed by gate contact 3b. Similarly, a second conductive strip forms cross-coupling interconnect 7b which electrically connects the drain region exposed by buried contact 6b to gate 1, exposed by gate contact 3a. In this way, the drain of each pull down transistor is electrically connected to the gate of the other pull down transistor in each cell and, thus, the two pull down transistors are cross-coupled.

Word line 8 is formed as a long conductive strip which extends across adjacent cells. Word line 8 also functions as the gate for the two pass transistors of each cell. The $V_{SS}$ line 9 which functions as a ground line is formed as a long conductive strip positioned to serve as the $V_{SS}$ line for adjacent SRAM cells on both sides in FIG. 2. In this example $V_{SS}$ line 9 is a composite of two materials. The first material is a doped region of the silicon substrate which is an extension of the source regions such as 4c and 4d of the pull down transistors. The second material is a layer of conductive material such as titanium silicide which covers and completely contacts the underlying doped region.

The $V_{CC}$ line 10 is formed as a conductive strip which is positioned above and orthogonal to gates 1 and 2 of the pull down transistors. $V_{CC}$ line 10 is insulated from the underlying cell components, typically by deposited silicon oxide.

Buried contacts 15a and 15b are formed as openings through an insulating layer to expose doped regions of the substrate between two word lines of adjacent cells, as can be inferred upon realizing that the four cell layout shown is repeated to form a memory array. Conductive portions 11a, 11b, which may be titanium silicide, completely cover each buried contact 15a, 15b. Although conductive portions 11a, 11b may overlap word line 8, they are insulated from it by the dielectric material which covers word line 8. Conductive portions 11a, 11b help connect the bit lines to the drains of the pass transistors of each cell as described below.

FIG. 3 adds load resistors, load resistor vias and metal bit lines to the layout of FIG. 2. Heavy solid line 26a outlines the load resistors. Mask opening lines 27a, 27b, and 27c outline load resistor vias 12a, 12b and 12c, respectively, which are openings formed in the insulating layer between the load resistors and underlying cell components so that the load resistors may contact selected cell components. The load resistor contacts $V_{CC}$ line 10 through load resistor via 12c and contacts interconnects 7a and 7b through load resistor vias 12a and 12b, respectively. In this way, the drain of each pull down transistor of the cell is connected to $V_{CC}$ line 10 through a load resistor, as is schematically illustrated in FIG. 1.

Solid lines 28a and 28b each outline conductive metal I lines 13a and 13b which run parallel to gates 1 and 2 of the pull down transistors. Metal lines 13a and 13b are insulated from the underlying cell components. Shading type 29 shown in FIG. 4 indicates conductive metal II lines 14a and 14b which run parallel to word line 8 and $V_{SS}$ line 9. Metal II lines 14a and 14b are positioned above but are insulated from metal I lines 13a and 13b. Together metal I lines 13a, 13b and metal II lines 14a, 14b help complete the circuitry of the SRAM array. Metal I lines 13a and 13b function as bit lines BL and $\overline{BL}$. Metal II line 14a functions as a low resistance word line by occasionally contacting word line 8 (contact not shown) to carry that current. Metal II line 14b acts as a global word line for supplying current to other word lines from the word line current source (not shown).

Contacts 16a and 16b connect the drains of the pass transistors and the bit lines. Contacts 16a and 16b are formed by depositing a layer of metal in vias opened in a dielectric layer and over the entire device. Etching the layer of metal in a well known manner produces metal I lines 13a and 13b overlying contacts 16a and 16b which electrically contact conductive portions 11a and 11b, respectively. Because the conductive portions 11a, 11b contact the drains of the pass transistors through buried contacts 15a, 15b, respectively, the electrical connection between the drains of the pass transistors and the bit lines is complete.

The circuit lines and interconnects of the cell, including word line 8, $V_{SS}$ line 9, $V_{CC}$ line 10, cross-coupling interconnects 7a and 7b and conductive portions 11a and 11b are conductive layers above the surface of the substrate. Therefore, each circuit line and interconnect consumes semiconductor substrate area.

SUMMARY OF THE INVENTION

Two primary goals in the design and fabrication of integrated circuits are the reduction of chip space needed for a circuit that performs a given function and the easing of critical dimensions in order to produce a more manufacturable chip.

The present invention facilitates either goal for an SRAM array by providing a compact SRAM cell layout. According to one embodiment of this invention, a memory cell has two transistors whose gates are substantially parallel to each other. One interconnect connects the gate of one transistor to an electrode of the other transistor. Another interconnect connects the gate of the other transistor to an electrode of the first transistor. The two gates and the two interconnects form substantially a rectangle. A power supply circuit line is coupled to the same electrodes that are coupled to the respective interconnects. This circuit line is disposed outside the rectangle formed by the gates and the interconnects. The circuit line and two interconnects are formed from one conductive layer.

In one example, the memory cell is a four transistor SRAM cell. The two transistors are the pull down transistors of the cell. One interconnect connects the gate of the first transistor to the drain of the second transistor. The other interconnect connects the gate of the second transistor to the drain of the first transistor. The circuit line is the $V_{CC}$ line which is connected to the two drains through load resistors. The two gates and the two interconnects form substantially a rectangle. The $V_{CC}$ line is disposed outside the rectangle. Since the $V_{CC}$ line is not between the interconnects, the two interconnects can be brought closer together, and thus the memory cell size can be reduced. Alternatively, an SRAM cell similarly sized compared to the prior art may be produced using relaxed critical dimensions, thereby providing a more manufacturable chip. At the same time, the $V_{CC}$ line and the interconnects are formed from one conductive layer which further simplifies the cell manufacturing. Further, a simple and elegant geometry is provided by a substantially rectangular formation of the two interconnects and the two gates.

Other embodiments and features of the invention are described below.

DETAILED DESCRIPTION OF THE INVENTION

The SRAM cell layout according to one embodiment of the present invention may be fabricated according to the method described in copending application Ser. No. 07/464,496, filed Jan. 12, 1990, entitled "Self Aligning Contact and Interconnect Structure," and in copending application Ser. No. 07/464,094 filed Jan. 12, 1990, entitled "High Resistance Polysilicon Load Resistor," both applications being incorporated here by reference.

Figure 1:
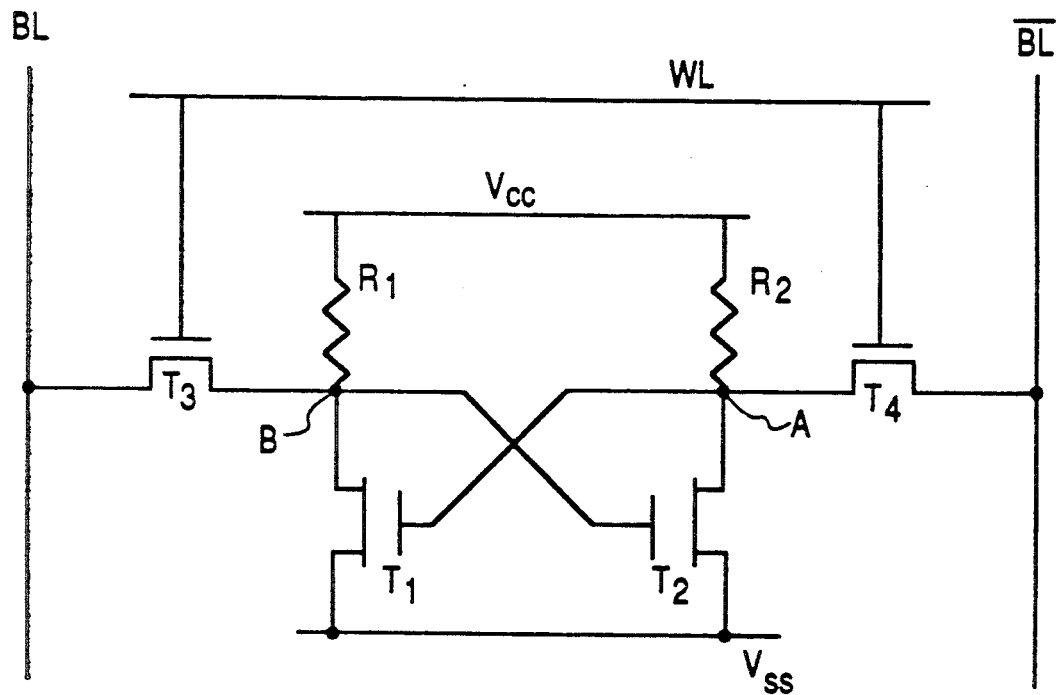
FIG. 1 is a schematic circuit diagram for a standard SRAM cell.
Figure 2:
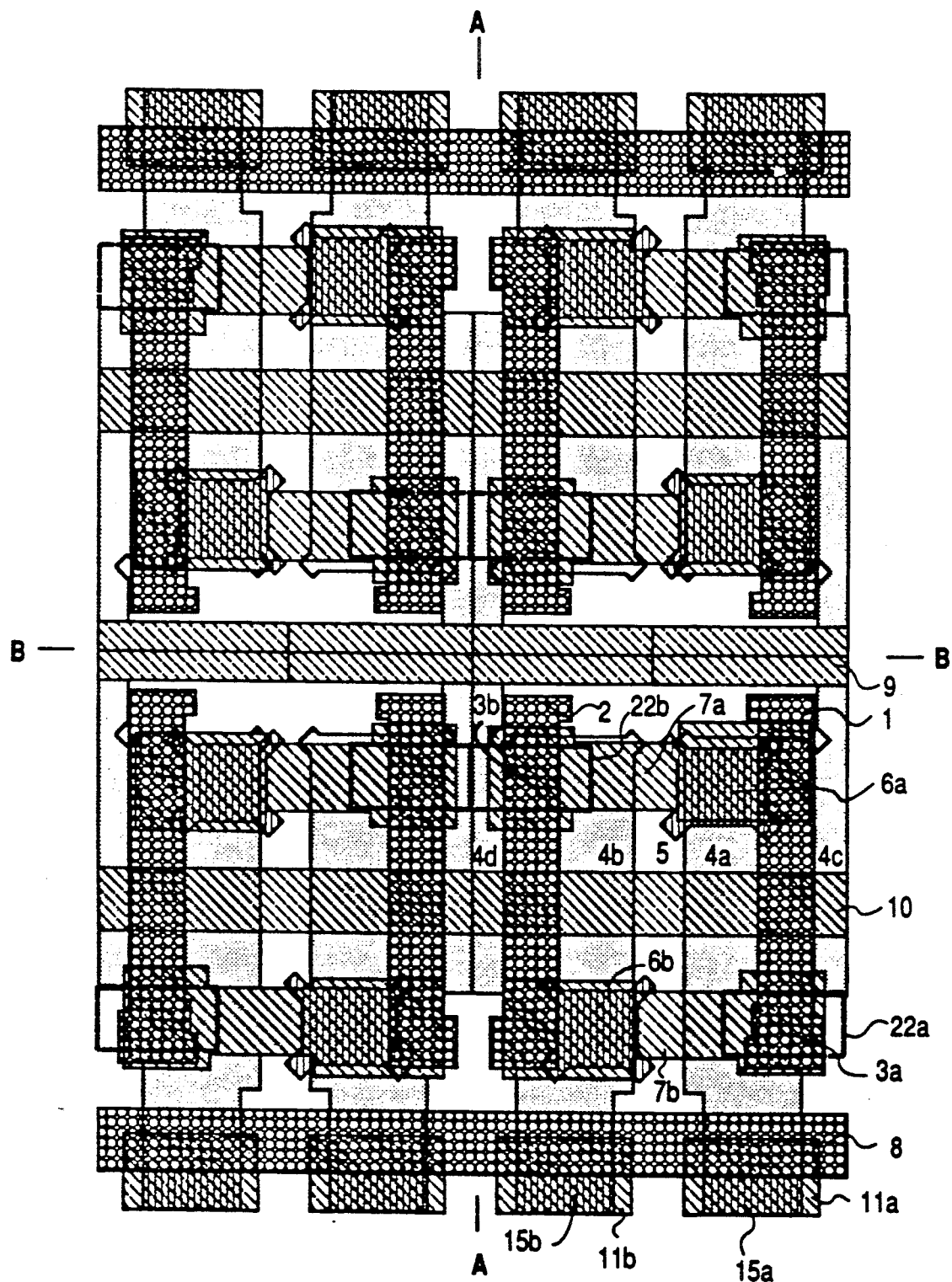
FIGS. 2 and 3 illustrate the layout of selected combinations of components of a group of four SRAM cells according to the prior art.
Figure 3:
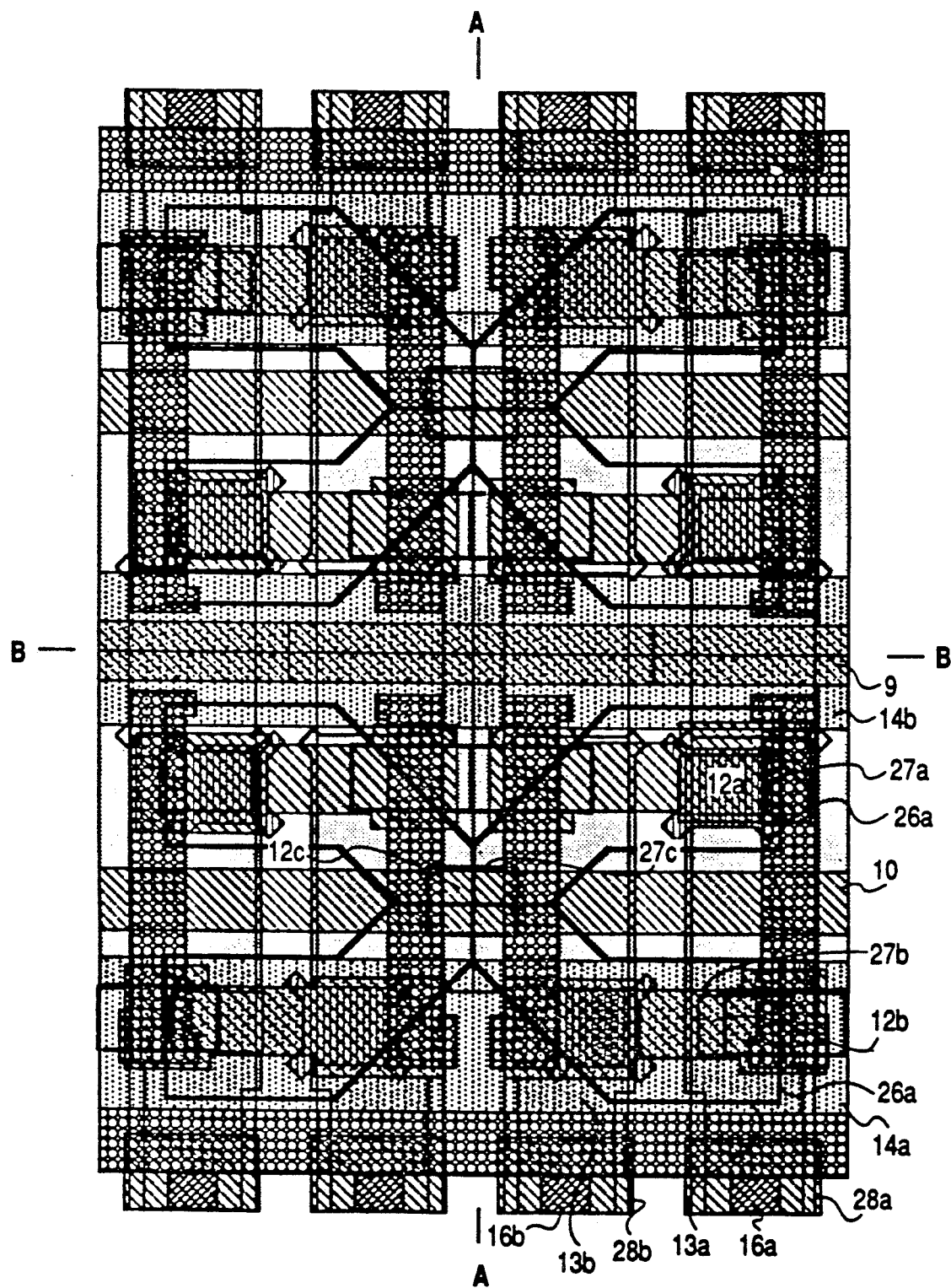

The SRAM cell circuit schematic illustrated in FIG. 1 and described above is applicable to an SRAM cell according to this invention.

Figure 4:
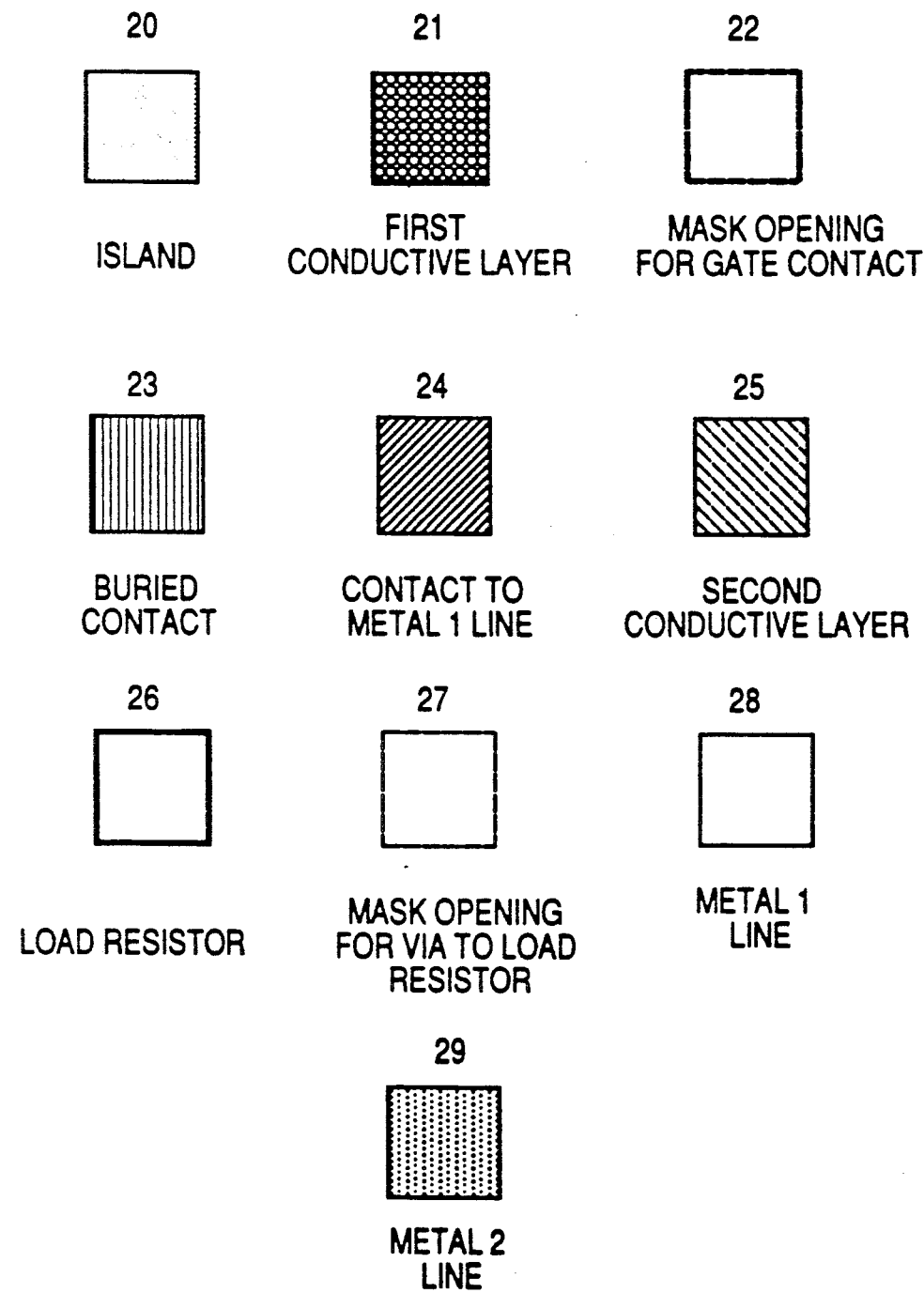
FIG. 4 is a legend for interpreting FIGS. 2,3 and 5-9.

FIG. 4 provides a legend for interpreting the SRAM cell layout according to one embodiment of this invention for which various components are shown in FIGS. 5-9. Shading 20 indicates an active island region. Shading 21 indicates the first conductive layer which forms transistor gates, word lines and other interconnects. This first conductive layer is typically formed of doped polycrystalline silicon (polysilicon). Mask lines 22 outline the mask opening for exposing contacts to the transistor gates. Shading 23 is used to show the positioning of buried contacts to source or drain regions. Shading 24 indicates contact regions in which metal is used to electrically connect the drains of the pass transistors to the bit lines formed from metal I lines.

Shading 25 indicates the second conductive layer which is used to form local interconnects, $V_{CC}$ lines and conductive portions between the semiconductor substrate and contacts This second conductive layer is typically formed of titanium silicide but any suitable conductive material may be used. For instance, the second conductive layer may be formed of a metal silicide such as tungsten or tantalum silicide, doped polysilicon or a partial layer of polysilicon covered by a partial layer of metal silicide.

Heavy, solid lines 26 outline load resistors which are typically formed from undoped or lightly doped polysilicon. Mask lines 27 outline openings for load resistor vias through which the load resistors contact the $V_{CC}$ lines and the drain regions of the pull down transistors.

Thin, solid lines 28 indicate the first metal layer, metal I, which is typically insulated from the underlying cell components by deposited boron-phosphorous silicate glass (BPSG). Metal I lines usually function as bit lines. Shading 29 indicates the second metal layer, metal II, which is typically insulated from the first metal layer by deposited silicon oxide. Metal II lines function as word lines and global word lines.

Figure 5:
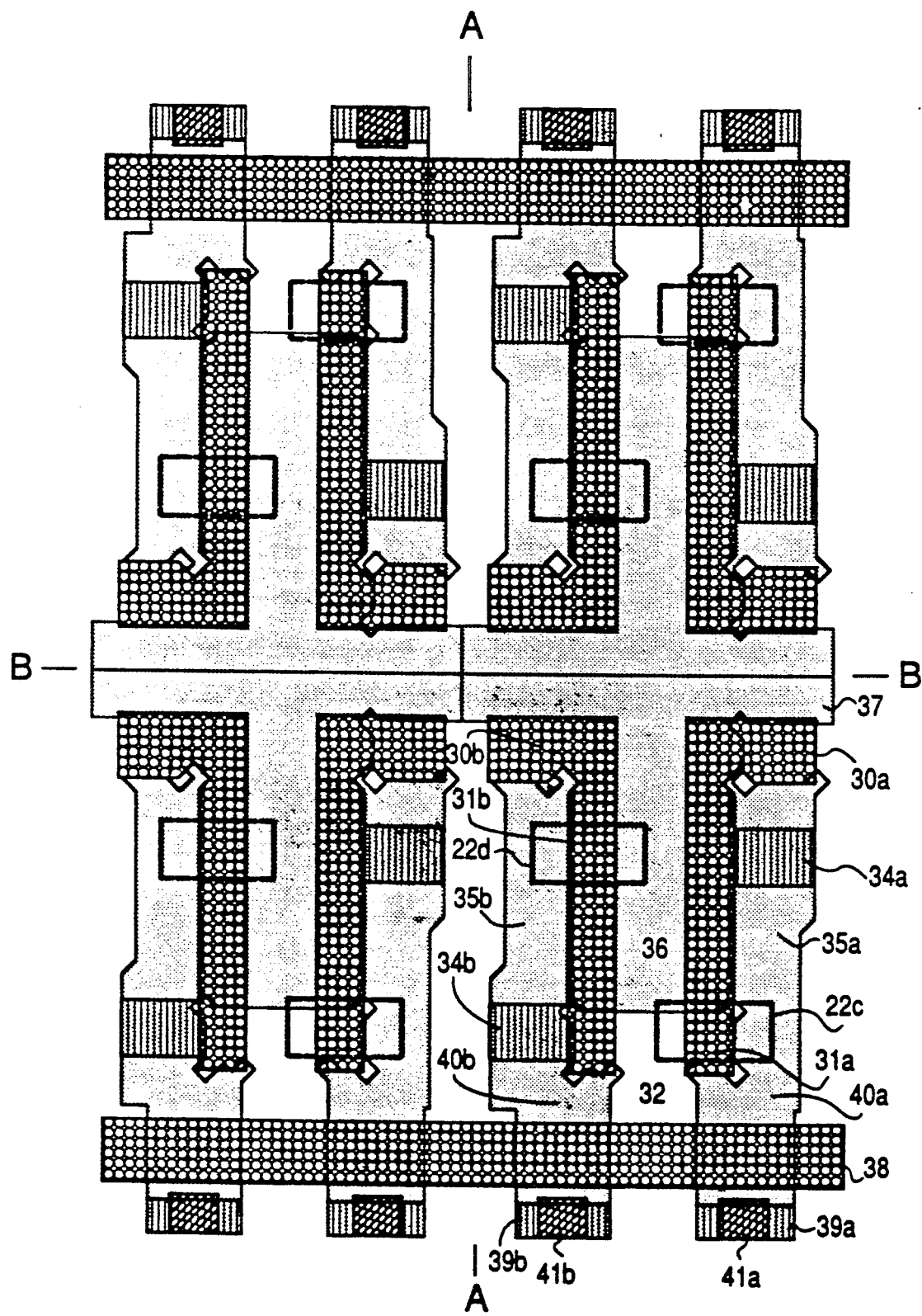
FIGS. 5, 6, 7 and 8 illustrate the layout of selected combinations of components for a group of four SRAM cells according to one embodiment of the present invention.

Referring to FIG. 5 which shows only some of the cell components for clarity, each SRAM cell occupies one quadrant of the layout shown as divided along lines A—A and B—B. Reference numerals 30a and 30b each indicate the gate of one pull down transistor in one SRAM cell. As shown by shading type 21, gates 30a and 30b are formed from the first conductive layer which is typically doped polysilicon. Mask lines 22c and 22d outline the mask openings used for forming gate contacts 31a and 31b to gates 30a and 30b, respectively, through a layer of insulating material which covers gates 30a,b. As shown by mask lines 22c and 22d, the mask openings used to form gate contacts 31a,b may be wider than the gates. In addition, gate contacts 31a,b can be made over the active region of the cell rather than over the field oxide as is typical in the prior art practiced elsewhere. The sizing of the mask openings and the placement of the gate contacts is accomplished using processing steps described in patent application Ser. No. 07/464,496.

Unshaded areas such as 32 represent field oxide. Buried drain contacts 34a and 34b are made to drain regions 35a and 35b of the pull down transistors in a self aligned manner as described in patent application Ser. No. 07/464,496. The two pull down transistors share a common source region 36 which extends to the $V_{SS}$ line 37 which is also the ground line. The $V_{SS}$ line 37 is formed as a conductive line in the silicon substrate by any suitable means, but typically $V_{SS}$ line 37 is doped with arsenic by diffusion to a resistance of approximately 50 ohms/square.

Because $V_{SS}$ line 37 is formed as an arsenic diffusion line in the silicon substrate, another conductive circuit line may be positioned above $V_{SS}$ line 37 if an insulation layer is provided between the two lines, thereby saving the lateral substrate space normally required for one circuit line.

Word line 38 is formed from the first conductive layer which is typically doped polysilicon, the same layer used to form gates 30a and 30b. Word line 38 also acts as the gate for both pass transistors of the cell. Drain regions 35a and 35b of the pull down transistors extend to the pass transistors to become source regions 40a and 40b. Buried contacts 39a and 39b expose the drain region of each of the two pass transistors by forming an opening in an overlying dielectric layer. Buried contacts 39a and 39b may be formed in a self-aligned manner, however, they are shown spaced away from word line 38 because the compact SRAM cell layout according to this invention allows cell components to be spaced farther apart when manufacturing an SRAM array comparable in size to prior art SRAM arrays. Contacts 41a and 41b connect the drain of each pass transistor to a bit line as described below.

Figure 6:
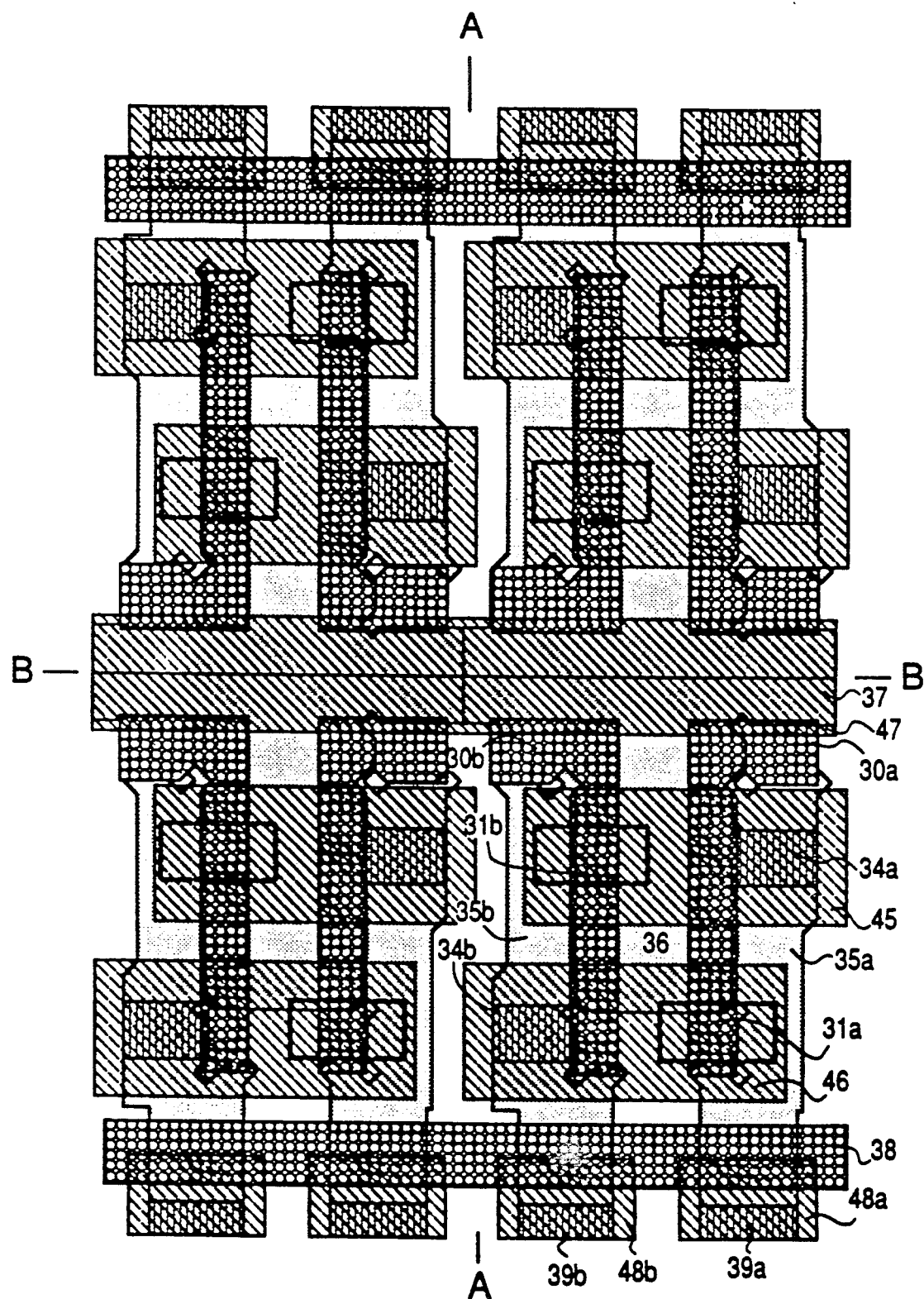

FIG. 6 illustrates all the components of FIG. 5, but in addition includes a second conductive layer. The second conductive layer shown by shading type 25 (see FIG. 4) is typically polysilicon of which a top layer has been converted to titanium silicide. Alternatively, the second conductive layer may be entirely or partially titanium silicide, tantalum silicide, tungsten silicide or any other suitable conductive material.

Local interconnect 45 electrically connects drain region 35a to gate 30b by contacting drain region 35a through buried drain contact 34a and by contacting gate 30b through gate contact 31b. Similarly, local interconnect 46 electrically connects drain region 35b to gate 30a by contacting drain region 35b through buried drain contact 34b and by contacting gate 30a through gate contact 31a. Local interconnects 45 and 46 are insulated from other, underlying cell components by dielectric layers such as silicon oxide and silicon nitride. Local interconnects 45 and 46 enable cross coupling of the two pull down transistors of the cell as is schematically illustrated in FIG. 1.

The $V_{CC}$ line 47 is also formed from the second conductive layer. $V_{CC}$ line 47 is positioned or stacked directly above $V_{SS}$ line 37 as illustrated by the two types of shading in that area, but a dielectric layer such as silicon oxide is sandwiched between the two lines to electrically insulate them from each other. This insulating dielectric layer is typically 1000–1500 Å thick. As explained above, by positioning $V_{CC}$ line 47 directly above $V_{SS}$ line 37 the space ordinarily consumed by the $V_{CC}$ line is saved. $V_{SS}$ line 37 functions as the ground line and is held at about 0 volts. $V_{CC}$ line 47 is DC powered and normally carries a potential of about 5 volts. With $V_{CC}$ line 47 positioned directly above $V_{SS}$ line 37, the two lines will become capacitively coupled when power is supplied to $V_{CC}$ line 47. However, because both lines are held at fixed potentials (neither line is ever made to switch potentials) the capacitive coupling does not affect operation of the SRAM circuit.

Conductive portions 48a and 48b completely cover the substrate area exposed by buried contacts 39a and 39b. However, conductive portions 48a and 48b are insulated from word line 38 by dielectric material which covers word line 38. A layer of dielectric material also covers conductive portions 48a,b but vias are opened in that dielectric layer to expose those portions of conductive portions 48a,b which will form an electrical connection with contacts 41a and 41b shown in FIG. 5 when metal is deposited in those vias. Contacts 41a and 41b will electrically connect later formed bit lines and the drains of the pass transistors through conductive portions 48a and 48b.

Figure 6A:
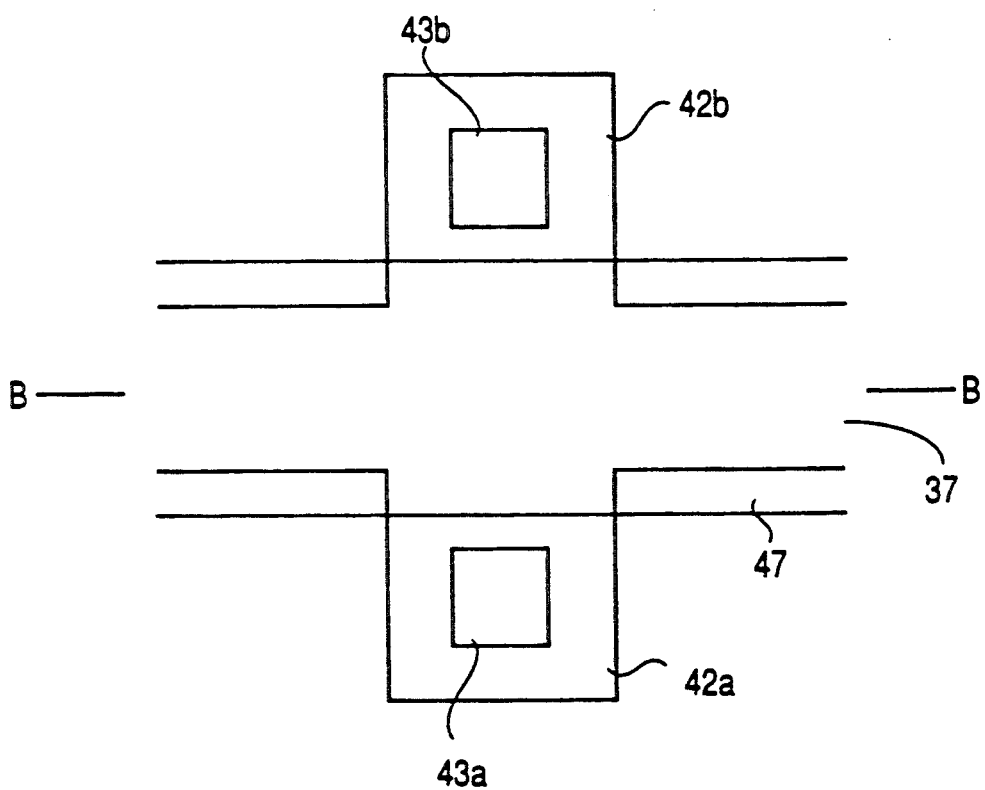
FIG. 6a shows an extention of the components of FIG. 6 to illustrate the manner in which the $V_{SS}$ line is contacted.

FIG. 6a illustrates the manner in which $V_{SS}$ line 37 is contacted after every eighth cell without electrically contacting $V_{CC}$ line 47. $V_{CC}$ line 47 runs directly above and coincident with $V_{SS}$ line 37 but is insulated from $V_{SS}$ line 37 by a silicon oxide layer which is typically 1000–1500 Å thick. After every eighth cell or at any point when electrical contact to $V_{SS}$ line 37 is desired, $V_{SS}$ line 37 extends outward to either side of $V_{CC}$ line 47 as doped areas of the semiconductor substrate, forming $V_{SS}$ extensions 42a and 42b. Vias are opened in a dielectric layer covering $V_{SS}$ extensions 42a,b so that $V_{SS}$ contacts 43a and 43b can contact $V_{SS}$ extensions 42a and 42b, respectively, through those vias in a well known manner. $V_{SS}$ contacts 43a,b will electrically connect $V_{SS}$ line 37 to a metallic circuit line as described below.

Figure 7:
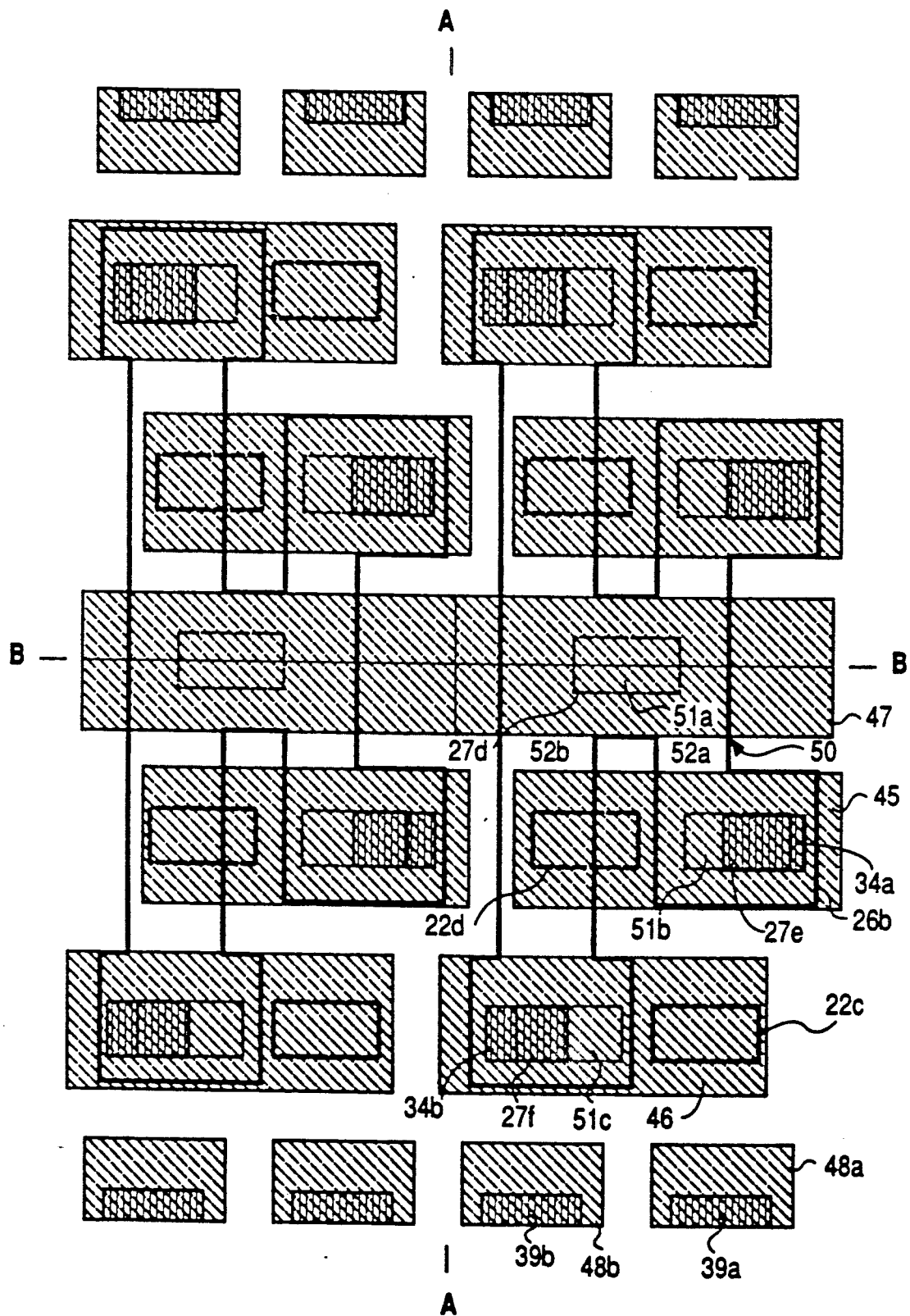

FIG. 7 illustrates only selected components of an SRAM cell according to one embodiment of this invention. Of the cell components shown in FIG. 6, FIG. 7 contains $V_{CC}$ line 47, local interconnects 45 and 46 and conductive portions 48a and 48b. Of the cell components shown in FIGS. 5 and 6, FIG. 7 contains mask openings for gate contacts 22c and 22d, buried drain contacts 34a and 34b and buried contacts 39a and 39b.

The heavy solid line 26b outlines load resistor 50 which is typically undoped or lightly doped polysilicon. Load resistor 50 has two legs 52a and 52b which each extend from $V_{CC}$ line 47 to one pull down transistor of the cell. Load resistor 50 is insulated from other components of the cell by an underlying dielectric layer through which vias 51a, 51b and 51c are formed. Mask opening lines 27d outline a load resistor via 51a through which load resistor 50 electrically contacts $V_{CC}$ line 47. Mask opening lines 27e and 27f outline load resistor vias 51b and 51c, through which the two legs 52a and 52b of load resistor 50 electrically contact buried drain contacts 34a and 34b, respectively.

Figure 8:
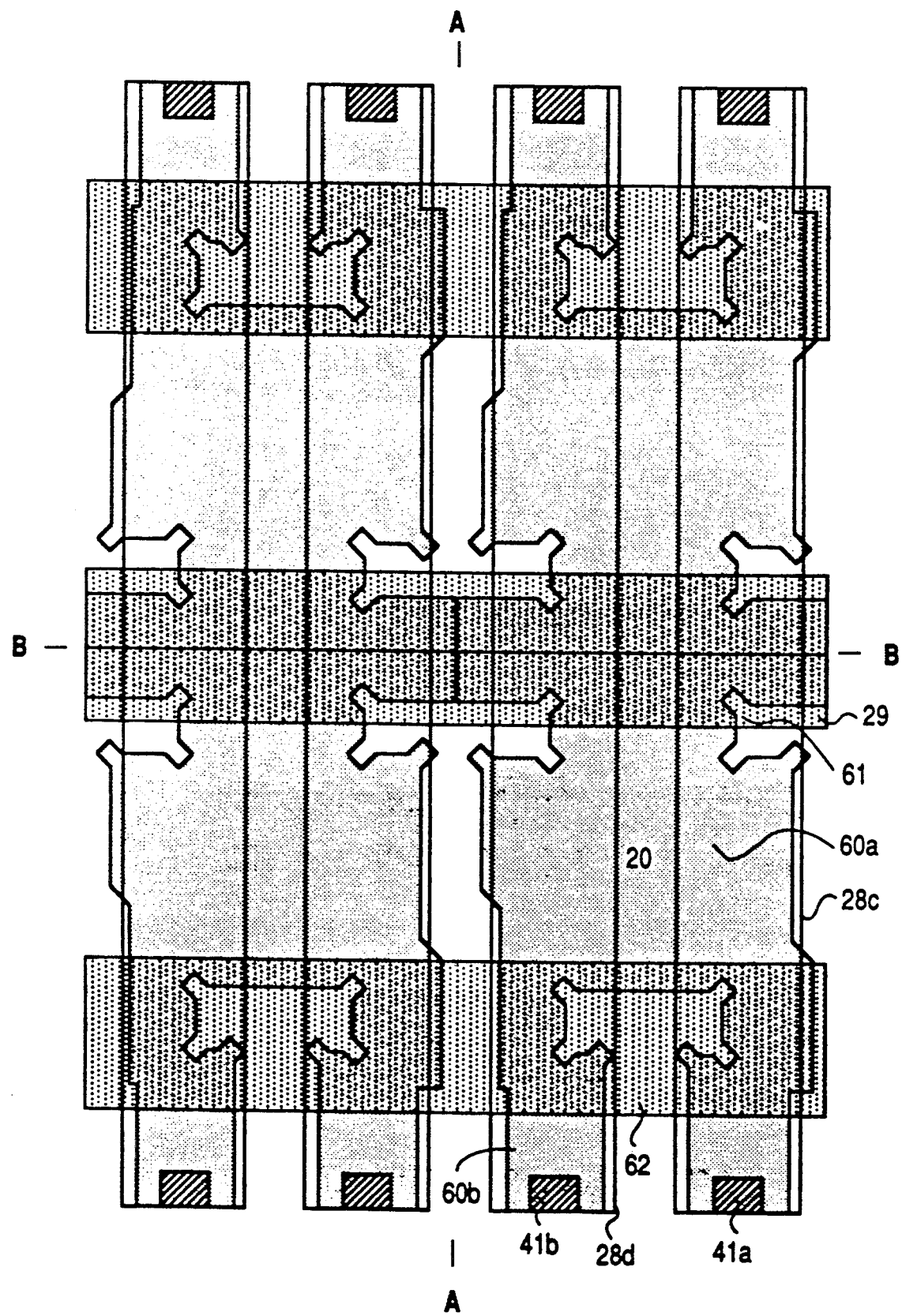

The selected cell components illustrated in FIG. 8 include an active region shown by shading 20 and contacts 41a and 41b. Solid lines 28c and 28d outline metal I lines 60a and 60b of the first metal layer which run orthogonal to $V_{CC}$ line 47 (not shown) and word line 38 (not shown). Metal I lines 60a and 60b are insulated from the underlying cell components by, for instance, boron-phosphorous silicate glass (BPSG). Metal I lines 60a and 60b, which are electrically connected to the drains of the pass transistors by contacts 41a and 41b, respectively, act as the bit lines BL and $\overline{BL}$ of the cells. Conductive lines formed from the metal I layer are also used for making electrical connections with $V_{SS}$ lines 37 through $V_{SS}$ contacts such as 43a,b shown in FIG. 6a.

Shading type 29 indicates conductive lines formed from a second metallic layer, metal II lines 61 and 62 running parallel to $V_{CC}$ line 47 (not shown) and word line 38 (not shown). Metal II lines 61 and 62 are positioned above but insulated from metal I lines 60a,b by a layer of dielectric material such as deposited silicon oxide. Metal I lines 60a,b, metal II lines 61, 62 and their accompanying insulating layers are all formed by well known techniques.

Metal II lines 62 functions as a low resistance word line. After a preselected number of cells a contact is formed to electrically connect word line 38 to metal II line 62. Because metal II line 62 typically has a lower resistance than word line 38, time delays are shortened by using metal II line 62 rather than word line 38 to conduct current throughout the entire memory array. Metal II line 61 is a global word line.

Figure 9:
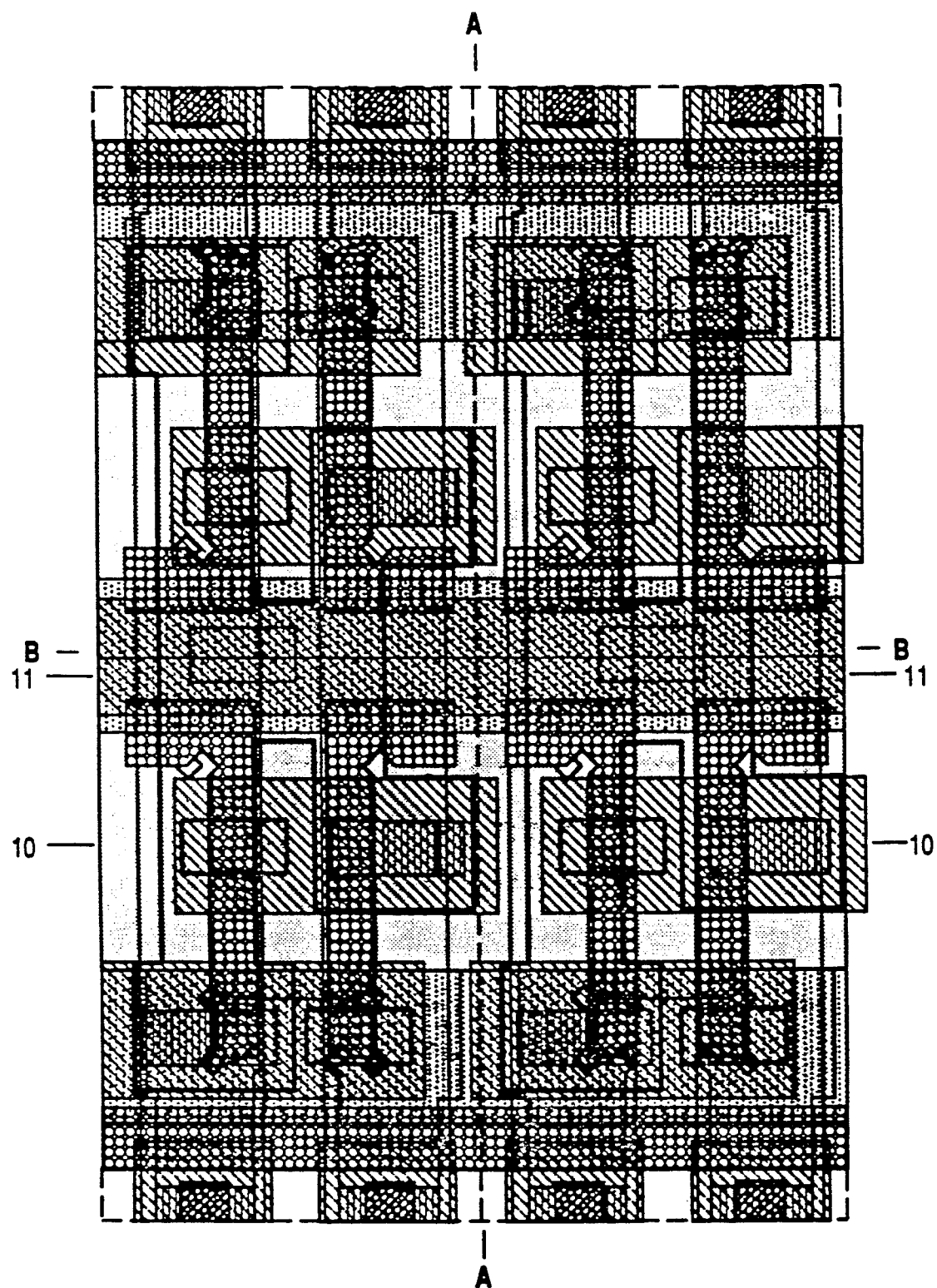
FIG. 9 illustrates the layout of all components of a group of four SRAM cells shown in FIGS. 5-8.
Figure 10:
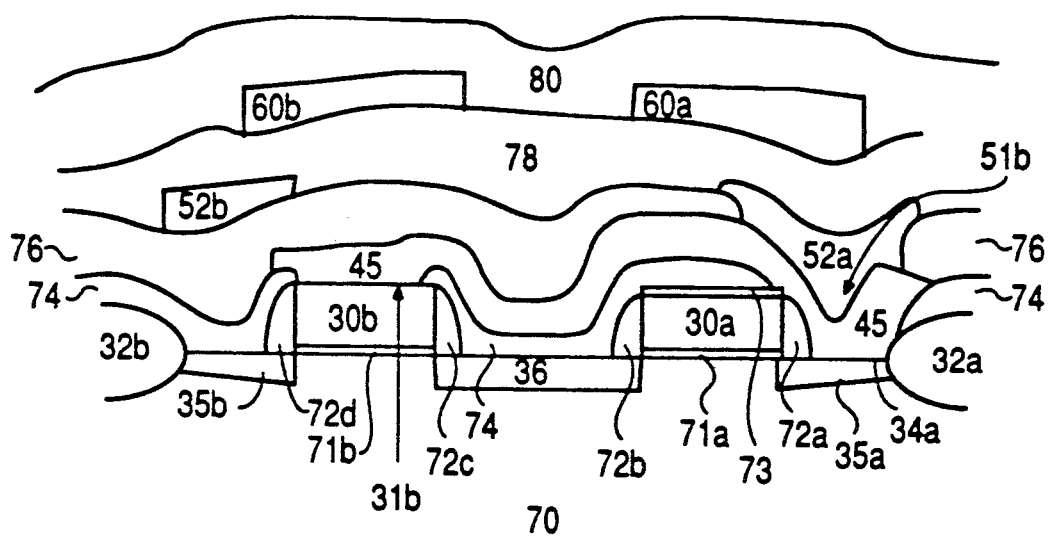
FIG. 10 is a cross-sectional view of an SRAM cell according to one embodiment of this invention taken along line 10—10 of FIG. 9.

FIG. 9 combines all components illustrated in FIGS. 5–8. A cross-sectional view of the lower right hand quadrant of FIG. 9 taken along line 10—10 is shown in FIG. 10. FIG. 10 includes several dielectric layers not explicitly shown in FIGS. 5–9. Cell components which are common to FIGS. 5–9 and FIG. 10 are indicated by like reference numerals. Structure and layers in addition to those shown in FIG. 10 may be included in an SRAM cell according to this invention. In particular, U.S. patent application Ser. Nos. 07/464,496 and 07/464,094 disclose a process for forming an SRAM cell which provides additional, beneficial structure to the cross-section of FIG. 10.

Starting from the bottom of FIG. 10 and moving upwards, reference numeral 70 refers to the semiconductor substrate on which an SRAM cell is formed. The common source region 36 of the two pull down transistors is located in semiconductor substrate 70 between gates 30a and 30b. Drain regions 35a and 35b are located in semiconductor substrate 70 between their respective gates and areas of field oxide 32a or 32b. Each gate 30a and 30b is insulated from substrate 70 by a thin layer of gate oxide, either 71a or 71b. Dielectric sidewall spacers 72a–d are formed on the side of each gate 30a,b in a well known manner.

Dielectric layer 74 insulates the underlying structure from later formed conductive layers. Vias opened in dielectric layer 74 define buried drain contact 34a which exposes drain region 35a and gate contact 31b which exposes gate 30b. Buried drain contact 34a can be formed in a self-aligned manner as described in U.S. patent application Ser. No. 07/464,496 if gate 30a is covered with a protective layer 73 which is typically silicon nitride. Cross-coupling interconnect 45 electrically connects gate 30b to drain region 35a through gate contact 31b and buried drain contact 34a. A second dielectric layer 76 insulates cross-coupling interconnect 45 from the next conductive layer. Load resistor via 51b is opened in oxide 76 so that load resistor leg 52a can electrically contact cross-coupling interconnect 45 and, thereby, drain region 35a. Load resistor leg 52b does not make electrical contact along the cross-section of FIG. 10.

A third dielectric layer 78 which may be a glass such as BPSG insulates load resistor legs 52a and 52b from metal I lines 60a and 60b. A fourth dielectric layer 80 insulates metal I lines 60a,b from metal II lines 61 and 62, however, no portion of the metal II lines is shown in FIG. 10 because they do not cross line 10—10 of FIG. 9.

Figure 11:
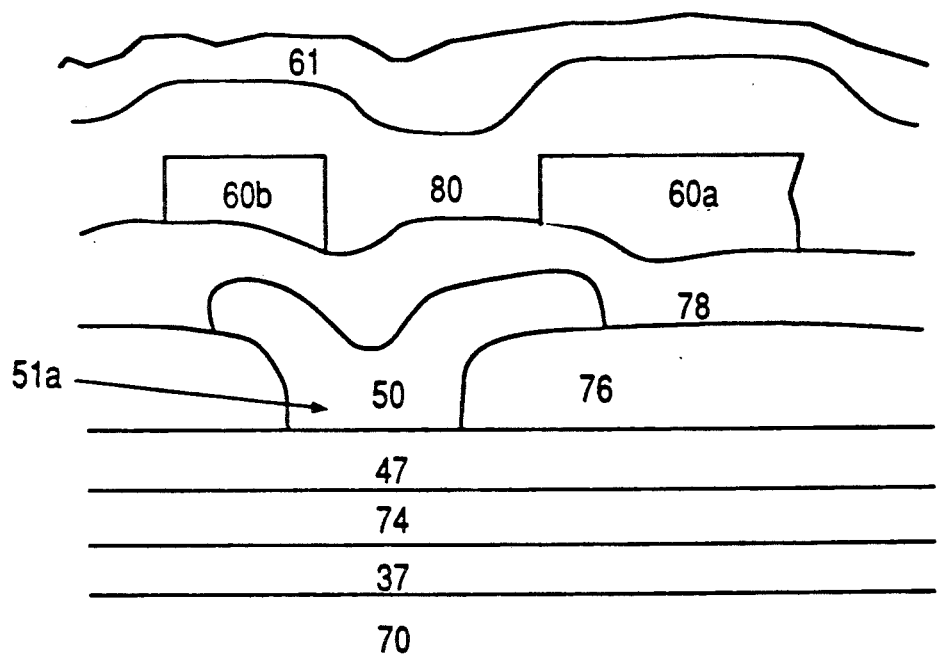
FIG. 11 is a cross-sectional view of an SRAM cell according to one embodiment of this invention taken along line 11—11 of FIG. 9.

A cross-sectional view of the lower right-hand quadrant of FIG. 9 taken along line 11—11 is shown in FIG. 11. $V_{SS}$ line 37 is a doped layer in semiconductor substrate 70. Dielectric layer 74 insulates $V_{SS}$ line 37 from $V_{CC}$ line 47 formed directly above it.

Load resistor via 51a is formed in second dielectric layer 76 so that load resistor 50 may electrically contact $V_{CC}$ line 47. Third dielectric layer 78 insulates the underlying cell components from metal I lines 60a,b. Fourth dielectric layer 80 insulates metal II line 61 (and 62, not shown) from metal I lines 60a,b.

Note that FIGS. 10 and 11 are not drawn to scale.

A complete SRAM array may be formed using the SRAM cell of the invention according to well known methods.

We claim:

1. A memory cell for use in an integrated circuit, comprising:
   a first transistor having a current handling electrode D1, another current handling electrode S1, and a gate G1;
   a second transistor having a current handling electrode D2, another current handling electrode S2, and having a gate G2 substantially parallel to said gate G1;
   a first interconnect electrically connecting said electrode D1 to said gate G2, said first interconnect being substantially orthogonal to said gates G1 and G2;
   a second interconnect electrically connecting said electrode D2 to said gate G1, said first and second interconnects being spaced laterally from each other, said first and second interconnects and said gates G1 and G2 defining a substantially rectangular region therebetween;
   a first circuit line spaced laterally from said first and second interconnects and disposed outside said substantially rectangular region, for providing power to said memory cell; and
   means for coupling said electrodes D1 and D2 to said first circuit line,
   wherein said first and second interconnects and said first circuit line are formed from one conductive layer.

2. The memory cell of claim 1, said memory cell being formed on a semiconductor substrate having a surface, said memory cell further comprising:
- a second circuit line formed as a conductive doped layer in said semiconductor substrate and positioned directly below said first circuit line, for providing power to said memory cell;
- means for coupling said second circuit line to said electrodes S1 and S2; and
- a dielectric layer between said first circuit line and said second circuit line for preventing electrical contact between said first circuit line and said second circuit line.

3. The memory cell of claim 2 wherein said second circuit line is a $V_{SS}$ line.

4. The memory cell of claim 1, wherein said means for coupling comprises:
- a dielectric layer overlaying said conductive layer and said electrodes D1 and D2, said dielectric layer having a first via therethrough, a second via therethrough, and a third via therethrough; and
- a contiguous resistive layer formed over said dielectric layer and in said first, second and third vias, said resistive layer electrically contacting said first circuit line through said first via, said electrode D1 through said second via, and said electrode D2 through said third via so as to provide a first load resistor coupled between said first circuit line and said electrode D1 and a second load resistor coupled between said first circuit line and said electrode D2.

5. The memory cell of claim 1, wherein said conductive layer comprises a layer of metal silicide.

6. The memory cell of claim 3, wherein said electrodes S1 and S2 are formed as a common contiguous region in said substrate, said common contiguous region extending to said $V_{SS}$ line.

7. A memory array having at least one row of memory cells,
- wherein each cell comprises a structure as recited in claim 1 and further comprises a first pass transistor having a current handling electrode coupled to the electrode D1 of said memory cell and a second pass transistor having a current handling electrode coupled to the electrode D2 of said memory cell;
- wherein said array further comprises, for each row, a first word line acting as a gate for the first and second pass transistors of all memory cells in said row and a second word line having a lower resistance than said first word line; and
- wherein, in each row, a contact is formed between the first and second word lines of said row after a preselected number of cells.

8. The memory array of claim 7, wherein the gates G1 and G2 of all said memory cells are formed from a first conductive layer;
- wherein all said first word lines are formed from said first conductive layer; and
- wherein all said second word lines are formed from a second conductive layer.

9. The memory array of claim 8,
- wherein said first conductive layer comprises doped polysilicon; and
- wherein said second conductive layer comprises metal.

10. The memory cell of claim 2,
- wherein said electrodes D1 and D2 are formed as conductive doped layers in said semiconductor substrate; and
- wherein said memory cell further comprises:
  - a first pass transistor having a current handling electrode SP1, said electrode SP1 being formed as a conductive doped layer in said semiconductor substrate, said electrodes SP1 and D1 forming a contiguous region extending substantially in parallel with said gates G1 and G2; and
  - a second pass transistor having a current handling electrode SP2, said electrode SP2 being formed as a conductive doped layer in said semiconductor substrate, said electrodes SP2 and D2 forming a contiguous region extending substantially in parallel with said gates G1 and G2.

11. A memory array having a row of memory cells, wherein each memory cell comprises a structure as recited in claim 2 and further comprises:
- a first pass transistor having a current handling electrode coupled to said electrode D1; and
- a second pass transistor having a current handling electrode coupled to said electrode D2; and
- wherein said array further comprises a substantially straight word line acting as a gate for each of the first and second pass transistors of each said memory cell.

12. The memory cell of claim 3 wherein said $V_{SS}$ line is formed by arsenic diffusion, said $V_{SS}$ line having a resistance to approximately 50 ohms/square.

13. The memory cell of claim 2 wherein said first circuit line is a $V_{CC}$ line.

14. The memory cell of claim 13 wherein said $V_{CC}$ line is at least partially formed of a metal silicide.

15. The memory cell of claim 2 wherein said dielectric layer is silicon oxide approximately 1000-1500 Angstroms thick.

16. A memory cell according to claim 1 wherein said memory cell is a static random access memory cell.

* * * * *

UNITED STATES PATENT AND TRADEMARK OFFICE
CERTIFICATE OF CORRECTION

PATENT NO.    : 5,124,774
DATED         : June 23, 1992
INVENTOR(S)   : Godinho et al.

It is certified that error appears in the above-identified patent and that said Letters Patent is hereby corrected as shown below:

```
Col. 1, line 34, delete "for" and insert --of or--.

Col. 5, line 45, delete ",".
```

Signed and Sealed this

Fourteenth Day of June, 1994

*Attest:*

BRUCE LEHMAN

*Attesting Officer*     Commissioner of Patents and Trademarks